United States Patent
Lee et al.

(10) Patent No.: US 9,941,340 B2
(45) Date of Patent: Apr. 10, 2018

(54) ORGANIC LIGHT-EMITTING DIODE DISPLAY INCLUDING A SHIELDING ELECTRODE WITH REDUCED CROSSTALK

(71) Applicant: Samsung Display Co., Ltd., Yongin-si, Gyeonggi-do (KR)

(72) Inventors: Kwang Sae Lee, Cheonan-si (KR); Mi Hae Kim, Asan-si (KR); Ji Hye Kim, Seoul (KR); Won Mi Hwang, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 19 days.

(21) Appl. No.: 15/019,851

(22) Filed: Feb. 9, 2016

(65) Prior Publication Data
US 2016/0247452 A1    Aug. 25, 2016

(30) Foreign Application Priority Data
Feb. 13, 2015    (KR) ........................ 10-2015-0022527

(51) Int. Cl.
*G09G 3/30*    (2006.01)
*H01L 27/32*    (2006.01)
(Continued)

(52) U.S. Cl.
CPC ...... *H01L 27/3262* (2013.01); *H01L 27/3272* (2013.01); *H01L 27/3276* (2013.01);
(Continued)

(58) Field of Classification Search
CPC .............. G09G 3/3233; H01L 27/3262; H01L 27/3276; H01L 27/3272; H01L 27/3265
(Continued)

(56) References Cited

U.S. PATENT DOCUMENTS

2010/0182303 A1* 7/2010 Takasugi .............. G09G 3/3233
345/76
2012/0229438 A1* 9/2012 Fujita .................... G09G 3/3233
345/211
(Continued)

FOREIGN PATENT DOCUMENTS

JP            5371063 B2      9/2013
KR    10-0461467 B1    12/2004
KR    10-0699999 B1      3/2007

*Primary Examiner* — Adam J Snyder
(74) *Attorney, Agent, or Firm* — Knobbe Martens Olson & Bear LLP

(57) ABSTRACT

An organic light-emitting diode display is disclosed. The display includes a scan line formed over a substrate and configured to carry a scan signal. First and second data lines are adjacent to each other and crossing the scan line. The first and second data lines are configured carry a data voltage. A driving voltage line crossing the scan line is configured to carry a driving voltage, and a switching transistor is electrically connected to the scan line and the data line and includes a switching drain electrode configured to output the data voltage. A driving transistor includes a driving gate electrode and a driving source electrode electrically connected to the switching drain electrode. An OLED is electrically connected to the driving drain electrode of the driving transistor, and a connector is connected to the driving gate electrode of the driving transistor and interposed between the first and second data lines.

17 Claims, 7 Drawing Sheets

(51) Int. Cl.
G09G 3/10 (2006.01)
G09G 3/3233 (2016.01)

(52) U.S. Cl.
CPC ... *G09G 3/3233* (2013.01); *G09G 2300/0819* (2013.01); *G09G 2300/0861* (2013.01); *G09G 2310/0262* (2013.01); *G09G 2320/045* (2013.01); *H01L 27/3265* (2013.01)

(58) Field of Classification Search
USPC .......................................... 345/76; 315/169.3
See application file for complete search history.

(56) References Cited

U.S. PATENT DOCUMENTS

2012/0306841 A1* 12/2012 Toya .................... G09G 3/3225
                                                      345/76
2014/0010066 A1    1/2014 Little et al.
2014/0034923 A1*  2/2014 Kim ..................... H01L 27/3297
                                                      257/40

* cited by examiner

ORGANIC LIGHT-EMITTING DIODE DISPLAY INCLUDING A SHIELDING ELECTRODE WITH REDUCED CROSSTALK

RELATED APPLICATIONS

This application claims priority to and the benefit of Korean Patent Application No. 10-2015-0022527 filed in the Korean Intellectual Property Office on Feb. 13, 2015, the entire contents of which are incorporated herein by reference.

BACKGROUND

Field

The described technology generally relates to an organic light-emitting diode display.

Description of the Related Technology

An organic light-emitting diode (OLED) includes two electrodes and an organic emission layer positioned therebetween. An electron injected from one electrode and a hole injected from the other electrode are coupled with each other in the organic emission layer to generate an exciton, and the exciton emits energy in the form of light. An OLED display includes a matrix of pixels each including i) an OLED which is a self-emissive device, ii) a plurality of thin film transistors (TFTs) for driving the OLED and iii) a storage capacitor. These transistors and the storage capacitor are connected via multiple wiring lines including a semiconductor, a gate line, or a data line.

Horizontal line patterns can be easily generated in a displayed image by a parasitic capacitance caused by overlapping wiring lines. In the presence of parasitic capacitance, a gate signal to the driving transistor will vary according to changes in the data signal. This unexpected change in gate signals across the display results in degraded image quality.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that minimizes parasitic capacitance between a wire transferring the data signal and a wire transferring the gate signal to prevent the gate signal from being changed due to changing of the data signal.

Another aspect is an OLED display that comprises a substrate, a scan line transmitting a scan signal on the substrate, a first data line and a second data line crossing the scan line and transmitting a data voltage adjacent to each other, a driving voltage line the crossing the scan line and transmitting a driving voltage, a switching transistor connected to the scan line and the data line and including a switching drain electrode outputting the data voltage, a driving transistor including a driving source electrode connected to the switching drain electrode, an OLED electrically connected the driving drain electrode of the driving transistor, a connecting member connected to a gate electrode of the driving transistor and disposed between the first data line and the second data line, a first shielding electrode between the connecting member and the first data line, and a second shielding electrode between the connecting member and the second data line. The first shielding electrode and the second shielding electrode are supplied with a voltage having a constant magnitude.

The first shielding electrode and the second shielding electrode can be connected to the driving voltage line.

The first shielding electrode and the first data line can extend parallel with each other, and the second shielding electrode and the second data line can extend parallel with each other.

The connecting member can be formed with the same layer as the first shielding electrode and the second shielding electrode.

The connecting member can be formed with the same layer as the first data line and the second data line.

The OLED display can further comprise a semiconductor including a switching channel of the switching transistor and a driving channel of the driving transistor on the substrate and a first gate insulating layer on the semiconductor, and the driving channel can be curved on a plane.

The OLED display can further comprise a storage capacitor including a first storage electrode formed on the first gate insulating layer and overlapping the driving channel, a second gate insulating layer covering the first storage electrode, and a second storage electrode formed on the second gate insulating layer and overlapping the first storage electrode, and the first storage electrode can be a driving gate electrode of the driving transistor.

The OLED display can further comprise an interlayer insulating layer covering the second storage electrode and the first data line and the second data line can be disposed on the interlayer insulating layer.

The connecting member, the first shielding electrode and the second shielding electrode, and the first data line and the second data line can be formed with the same layer.

Another aspect is an organic light-emitting diode (OLED) display comprising: a substrate; a scan line formed over the substrate and configured to carry a scan signal; a first data line and a second data line adjacent to each other and crossing the scan line, wherein the first and second data lines are configured carry a data voltage; a driving voltage line crossing the scan line and configured to carry a driving voltage; a switching transistor electrically connected to the scan line and the data line and including a switching drain electrode configured to output the data voltage; a driving transistor including a driving gate electrode and a driving source electrode electrically connected to the switching drain electrode; an OLED electrically connected to the driving drain electrode of the driving transistor; a connector connected to the driving gate electrode of the driving transistor and interposed between the first and second data lines; a first shielding electrode interposed between the connector and the first data line; and a second shielding electrode interposed between the connector and the second data line, wherein the first and second shielding electrodes are connected to a voltage source having a constant magnitude.

In the above OLED display, the first and second shielding electrodes are electrically connected to the driving voltage line.

In the above OLED display, the first shielding electrode and the first data line extend parallel with each other, wherein the second shielding electrode and the second data line extend parallel with each other.

In the above OLED display, the connector is formed on the same layer as the first and second shielding electrodes.

In the above OLED display, at least a portion of the connector is formed on the same layer as the first and second data lines.

In the above OLED display, at least a portion of the first shielding electrode and the first data line extend parallel with each other, wherein the second shielding electrode and the second data line extend parallel with each other.

In the above OLED display, at least a portion of the connector is formed on the same layer as the first and second shielding electrodes.

In the above OLED display, at least a portion of the connector is formed on the same layer as the first and second data lines.

In the above OLED display, at least a portion of the connector is formed on the same layer as the first and second shielding electrodes.

In the above OLED display, the connector is formed on the same layer as the first and second data lines.

The OLED display further comprises: a semiconductor formed over the substrate and including a switching channel of the switching transistor and a driving channel of the driving transistor; and a first gate insulating layer formed over the semiconductor, wherein the driving channel is curved.

The OLED display further comprises: a storage capacitor including a first storage electrode formed over the first gate insulating layer and overlapping the driving channel; a second gate insulating layer covering the first storage electrode; and a second storage electrode formed over the second gate insulating layer and overlapping the first storage electrode in the depth dimension of the OLED display, wherein the first storage electrode includes the driving gate electrode of the driving transistor.

The OLED display further comprises an interlayer insulating layer covering the second storage electrode, wherein the first and second data lines are formed over the interlayer insulating layer.

In the above OLED display, the connector, the first and second shielding electrodes, and the first and second data lines are formed on the same layer.

In the above OLED display, the connector, the first and second shielding electrodes, and the first and second data lines are formed on the same layer.

Another aspect is an organic light-emitting diode (OLED) display comprising: a substrate; a first data line formed over the substrate and configured to carry a data voltage; a driving voltage line formed over the substrate and parallel to the first data line, wherein the driving voltage line is configured to carry a driving voltage; a data connector interposed between the first and second data lines; and a first shielding electrode interposed between the data connector and the first data line, wherein the first shielding electrode is connected to a voltage source having a constant magnitude.

The OLED display further comprises: a second data line formed over the substrate and parallel to the first data line, wherein the second data line is configured to carry a data voltage; and a second shielding electrode interposed between the data connector and the second data line, wherein the second shielding electrode is electrically connected to the voltage source.

In the above OLED display, the data connector is interposed between the first and second shielding electrodes.

In the above OLED display, the first and second shielding electrodes are formed on the same layer.

In the above OLED display, the first and second data lines are formed on the same layer as the first and second shielding electrodes.

The OLED display further comprises an OLED formed over the substrate and overlapping the first and second shielding electrodes in the depth dimension of the OLED display.

In the above OLED display, the OLED overlaps the data connector in the depth dimension of the OLED display.

According to at least one of the disclosed embodiments, the parasitic capacitance between the data signal and the gate signal can be minimized, and thereby the changing of the gate signal by changing of the data signal can be prevented.

DETAILED DESCRIPTION OF CERTAIN INVENTIVE EMBODIMENTS

Figure 1:
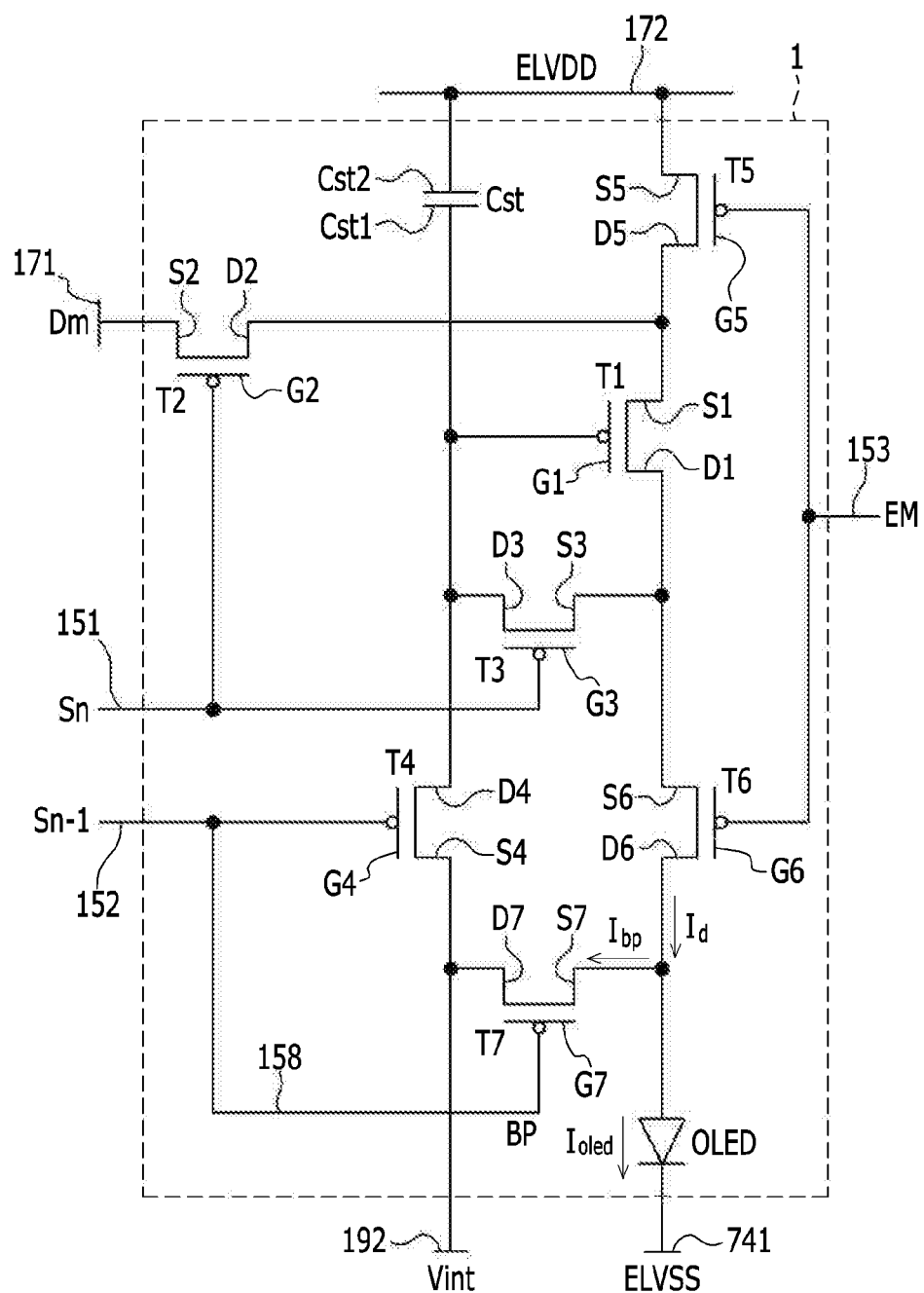
FIG. 1 is an equivalent circuit diagram of one pixel of an OLED display according to an exemplary embodiment.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

Parts that are irrelevant to the description will be omitted to clearly describe the described technology, and the same elements will be designated by the same reference numerals throughout the specification.

In addition, the size and thickness of each configuration shown in the drawings are arbitrarily shown for better understanding and ease of description, and the described technology is not limited thereto.

In the drawings, the thickness of layers, films, panels, regions, etc., are exaggerated for clarity. In the drawings, for better understanding and ease of description, the thickness of some layers and areas is exaggerated.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, and does not essentially mean positioning on the upper side of the object portion based on a gravity direction.

Further, in the specification, the word "on a flat surface" means when an object portion is viewed from above, and the word "on a cross-section" means when a cross-section taken by vertically cutting an object portion is viewed from the side. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Now, an equivalent circuit diagram of one pixel of an OLED display according to an exemplary embodiment will be described in detail with reference to FIG. 1. FIG. 1 is an equivalent circuit diagram of one pixel of an OLED display according to an exemplary embodiment.

Referring to FIG. 1, one pixel 1 of the OLED display according to the exemplary embodiment includes a plurality of signal lines 151, 152, 153, 158, 171, 172, and 192, a plurality of transistors T1, T2, T3, T4, T5, T6, and T7 connected to the plurality of signal lines, a storage capacitor Cst, and an OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be substantially parallel with the data line 171, and an initialization voltage line 192 transferring an initialization voltage Vint initializing the driving transistor T1. The driving voltage line 172 includes a first shielding electrode 172a and a second shielding electrode 172b.

A gate electrode G1 of the driving transistor T1 is connected to one end Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm according to a switching operation of the switching transistor T2 to supply a driving current Id to the OLED.

A gate electrode G2 of the switching transistor T2 is connected to the scan line 151, a source electrode S2 of the switching transistor T2 is connected to the data line 171, and a drain electrode D2 of the switching transistor T2 is connected to the source electrode S1 of the driving transistor T1 and with the driving voltage line 172 via the operation control transistor T5. The switching transistor T2 is turned on according to the scan signal Sn received through the scan line 151 to perform a switching operation transferring the data signal Dm transferred to the data line 171 to the source electrode of the driving transistor T1.

A gate electrode G3 of the compensation transistor T3 is directly connected to the scan line 151, and a source electrode S3 of the compensation transistor T3 is connected to the drain electrode D1 of the driving transistor T1 and to an anode of the OLED via the emission control transistor T6. A drain electrode D3 of the compensation transistor T3 is connected to one end Cst1 of the storage capacitor Cst and the drain electrode D4 of the initialization transistor T4, and the gate electrode G1 of the driving transistor T1 together. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected to the previous scan line 152, a source electrode S4 of the initialization transistor T4 is connected to an initialization voltage line 154, and a drain electrode D4 of the initialization transistor T4 is connected to one end Cst1 of the storage capacitor Cst, the drain electrode D3 of the compensation transistor T3, and the gate electrode G1 of the driving transistor T1 together. The initialization transistor T4 is turned on according to a previous scan signal Sn−1 received through the previous scan line 152 to transfer the initialization voltage Vint to the gate electrode G1 of the driving transistor T1 and then perform an initialization operation of initializing a voltage of the gate electrode G1 of the driving transistor T1.

A gate electrode G5 of the operation control transistor T5 is connected to the light emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the emission control transistor T6 is connected to the light emission control line 153, the source electrode S6 of the first emission control transistor T6 is connected to the drain electrode D1 of the driving transistor T1 and the source electrode S3 of the compensation transistor T3, and the drain electrode D6 of the first emission control transistor T6 is electrically connected to the anode of the OLED. The operation control transistor T5 and the first emission control transistor T6 are simultaneously turned on according to the emission control signal EM transmitted to the light emission control line 153 such that the driving voltage ELVDD is compensated through the diode-connected driving transistor T1 and is transmitted to the OLED.

A gate electrode G7 of the thin film bypass transistor T7 is connected to the bypass control line 158, a source electrode S7 of the bypass thin film transistor T7 is together connected to the drain electrode D6 of the light emission control thin film transistor T6 and the anode of the OLED together, and a drain electrode D7 of the bypass thin film transistor T7 is connected to the initialization voltage line 192 and the source electrode S4 of the initialization thin film transistor T4. Here, the bypass control line 158 is connected to the previous scan line 152 such that the bypass signal BP is the same previous scan signal Sn−1.

The other end Cst2 of the storage capacitor Cst is connected to the driving voltage line 172, and a cathode of the OLED is connected to a common voltage line 741 transferring a common voltage ELVSS.

A gate signal supplied to the gate electrode G1 of the driving transistor T1 can be changed by changing the data signal Dm supplied the data line 171 adjacent to the gate electrode G1 due to a crosstalk between the gate signal and the data signal Dm. This crosstalk changes the magnitude of the gate voltage, and as a result, display quality can deteriorate. However, in the OLED display according to the exemplary embodiment, the first shielding electrode 172a and the second shielding electrode 172b of the driving voltage line 172 transferring the driving voltage (ELVDD) having a constant magnitude are disposed between the first data connecting member 174 connected to the driving gate electrode 155a and the data lines 171. Accordingly, the crosstalk between the gate signal and the data signal can be prevented. This will be described below in more detail.

Meanwhile, in the exemplary embodiment, the structure having seven transistors including the bypass transistor T7 and one capacitor is illustrated, but the described technology is not limited thereto, and the number of transistors and the number of capacitors can be variously modified.

Hereinafter, a detailed operation process of one pixel of the pixel unit of the OLED display device according to the exemplary embodiment will be described in detail with reference to FIG. 2.

Figure 2:
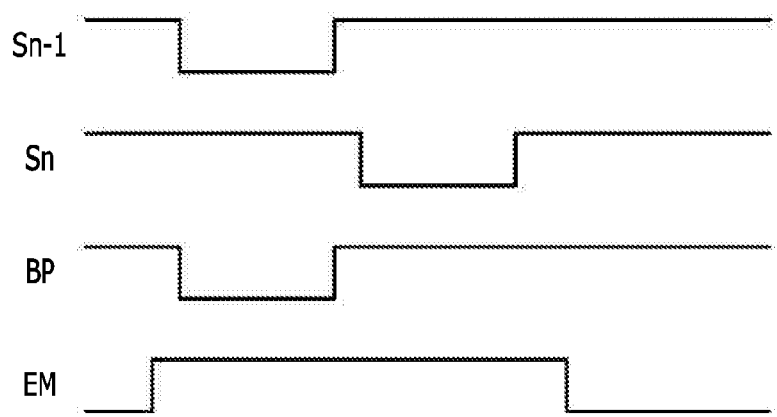
FIG. 2 is a timing diagram of signals applied to one pixel of an OLED display according to an exemplary embodiment.

FIG. 2 is a timing diagram of signals applied to one pixel of an OLED display according to an exemplary embodiment.

As shown in FIG. 2, first, for an initializing period, the previous scan signal S(n−1) having a low level is supplied through the previous scan line 152. Then, the initializing thin film transistor T4 is turned on in response to the previous scan signal S(n−1) having the low level, the initial voltage Vint is connected to the gate electrode G1 of the driving transistor T1 from the initialization voltage line 194 through the initializing thin film transistor T4, and then the driving thin film transistor T1 is initialized by the initialization voltage Vint.

Thereafter, for a data programming period, the scan signal Sn having a low level is supplied through the scan line 151. Then, the switching thin film transistor T2 and the compensating thin film transistor T3 are turned on in response to the scan signal Sn having the low level. At this time, the driving transistor T1 is diode-connected through the turned-on compensation transistor T3 and is biased in a forward direction.

Then, a compensation voltage Dm+Vth (Vth is a negative (−) value) reduced by a threshold voltage Vth of the driving thin film transistor T1 from a data signal Dm supplied from the data line 171 is applied to the gate electrode G1 of the driving thin film transistor T1. The driving voltage ELVDD and the compensation voltage (Dm+Vth) are applied to both terminals of the storage capacitor Cst, and a charge corresponding to a voltage difference between both terminals is stored in the storage capacitor Cst.

Next, during the emission period, the emission control signal EM supplied from the emission control line 153 is changed from the high level into the low level. Thus, the operation control transistor T5 and the emission control transistor T6 are turned on by the emission control signal EM of the low level during the emission period.

Thus, a driving current Id is generated according to the voltage difference between the gate voltage of the gate electrode G1 of the driving transistor T1 and the driving voltage ELVDD, and the driving current Id is supplied to the OLED through the emission control transistor T6. The gate-source voltage Vgs of the driving thin film transistor T1 is maintained as "(Dm+Vth)−ELVDD" by the storage capacitor Cst for the emission period, and according to a current-voltage relationship of the driving thin film transistor T1, the driving current $1d$ is proportional to the square "$(Dm-ELVDD)^2$" of a value obtained by subtracting the threshold voltage from the source-gate voltage. Accordingly, the driving current Id is determined regardless of the threshold voltage Vth of the driving thin film transistor T1.

In this case, the bypass transistor T7 is transmitted with the bypass signal BP from the bypass control line 158. The bypass signal BP is a voltage of a predetermined level that can always turn off the bypass transistor T7 and the bypass transistor T7 receives the voltage of the off level of the transistor through the gate electrode G7, such that the bypass transistor T7 is always in the off state and the portion of the driving current Id is discharged as the bypass current Ibp through the bypass transistor T7 in the off state.

When a minimum current of the driving transistor T1 displaying the black image flows as the driving current, if the OLED is also emitted, the black image is not normally displayed. Accordingly, the bypass transistor T7 of the OLED display according to an exemplary embodiment can disperse the portion of the minimum current of the driving transistor T1 as the bypass current Ibp through the other current path beside the current path of the OLED side. Here, the minimum current of the driving transistor T1 means the current in a condition that the driving transistor T1 is turned off since the gate-source voltage Vgs of the driving transistor T1 is smaller than the threshold voltage Vth. The minimum driving current (for example, a current of about 10 pA or less) under the condition in which the driving transistor T1 is turned off is transferred to the OLED to be expressed as an image with black luminance. When the minimum driving current expressing the black image flows, an influence on a bypass transfer of the bypass current Ibp is large, but when a large driving current expressing an image such as a normal image or a white image flows, there can be little influence on the bypass current Ibp. Accordingly, when the driving current displaying a black image flows, the light emission current holed of the OLED which is reduced by the current amount of the bypass current Ibp which flows out from the driving current $1d$ through the bypass transistor T7 has a minimum current amount as a level which can exactly express the black image. Therefore, a black luminance image is exactly implemented by using the bypass transistor T7, thereby improving a contrast ratio. In FIG. 2, the bypass signal BP is the same as a next scan signal Sn+1, but is not necessarily limited thereto.

Figure 3:
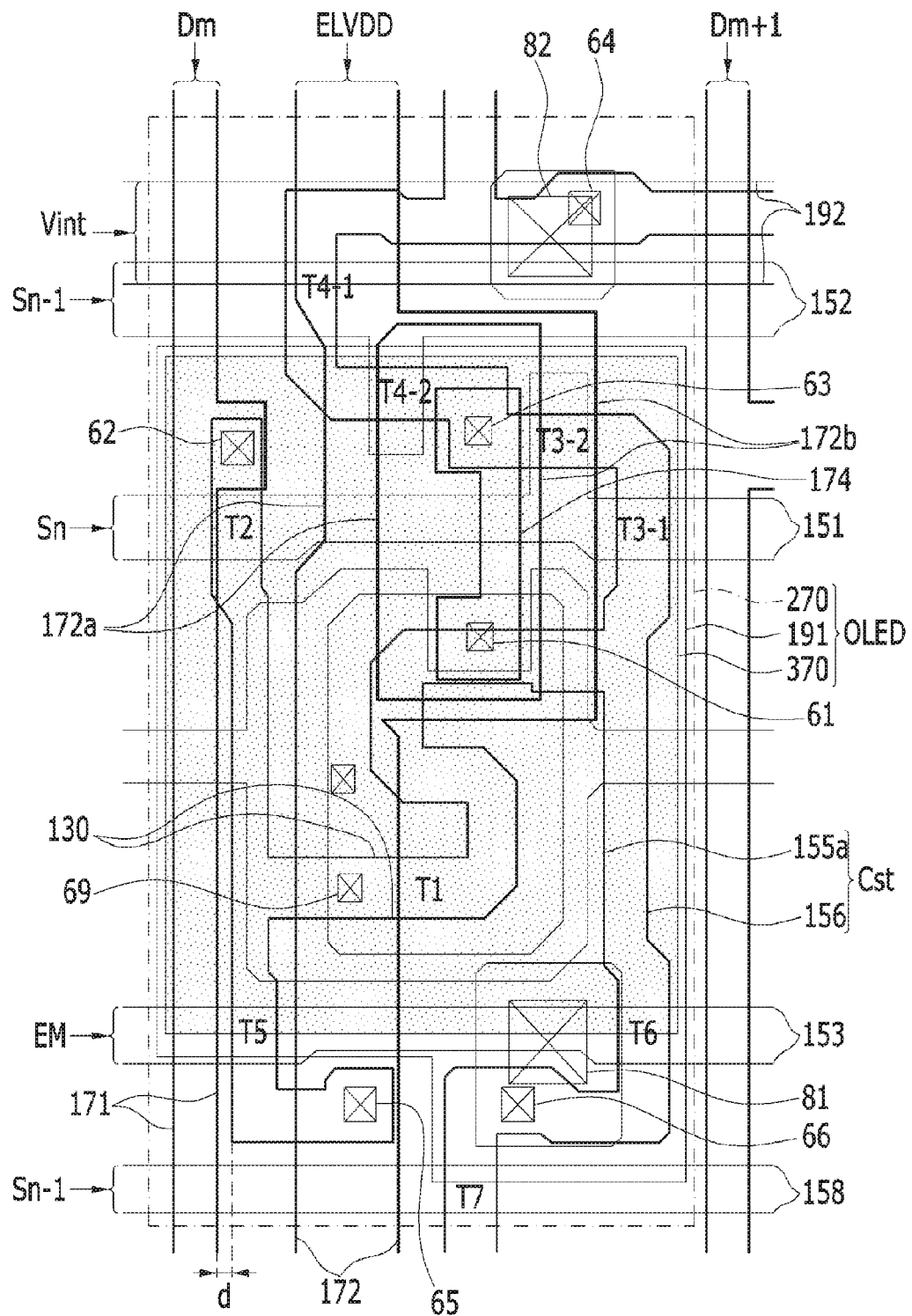
FIG. 3 is a layout view of an OLED display according to an exemplary embodiment.
Figure 4:
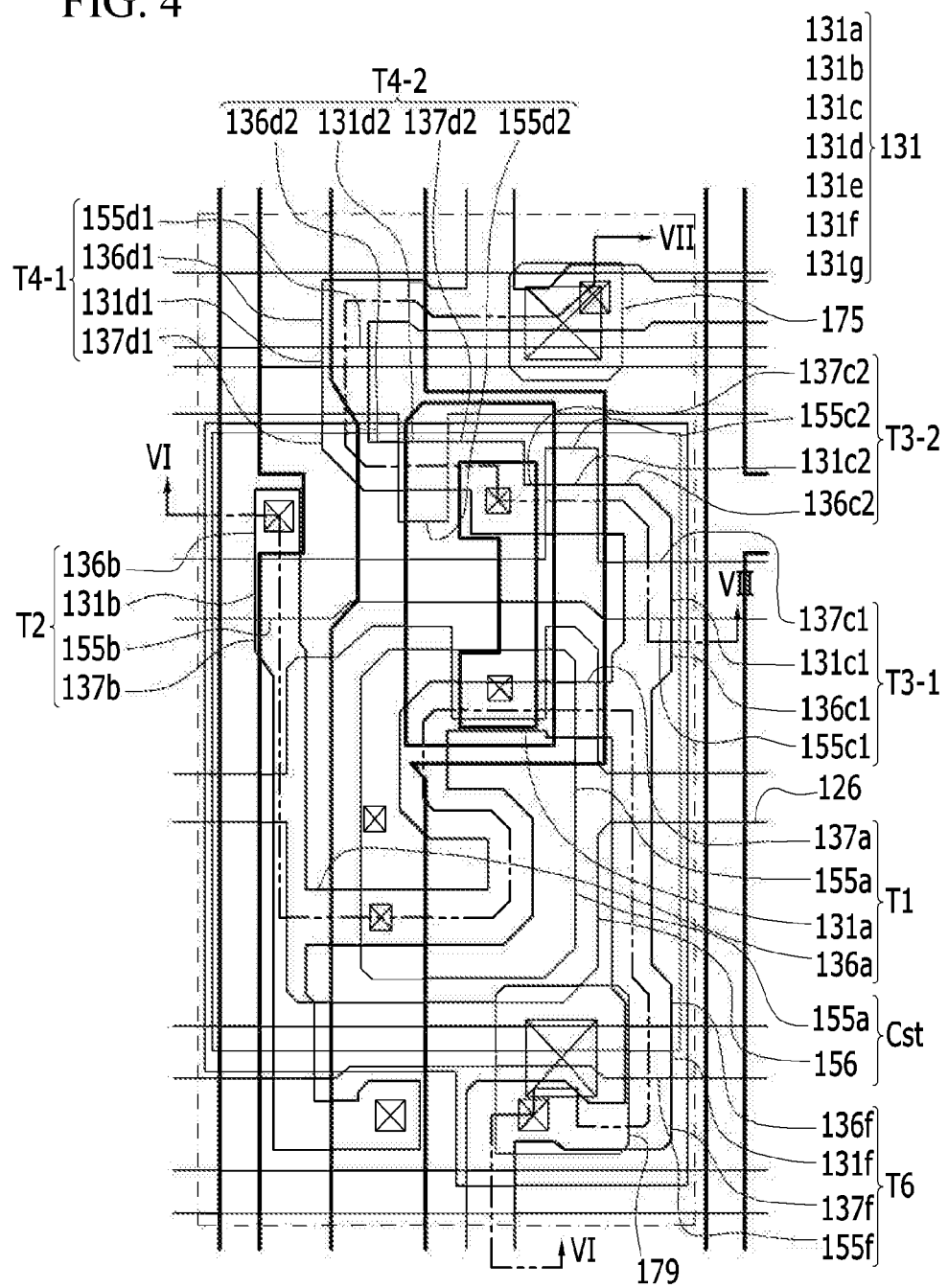
FIG. 4 is a view schematically illustrating a plurality of transistors and capacitors of the OLED display of FIG. 3.
Figure 5:
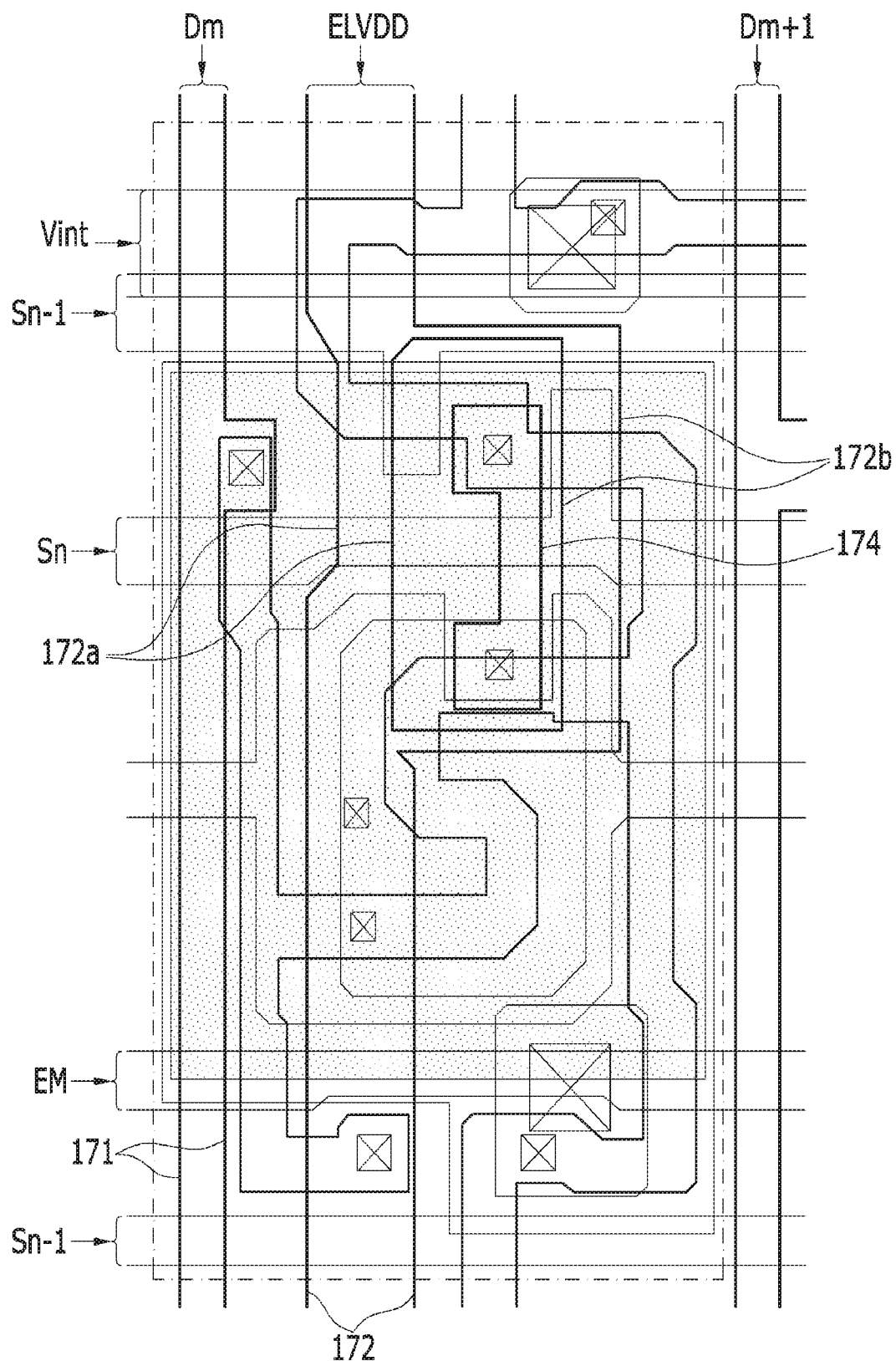
FIG. 5 is a specific layout view of illustrating signal lines of the OLED display of FIG. 3.
Figure 6:
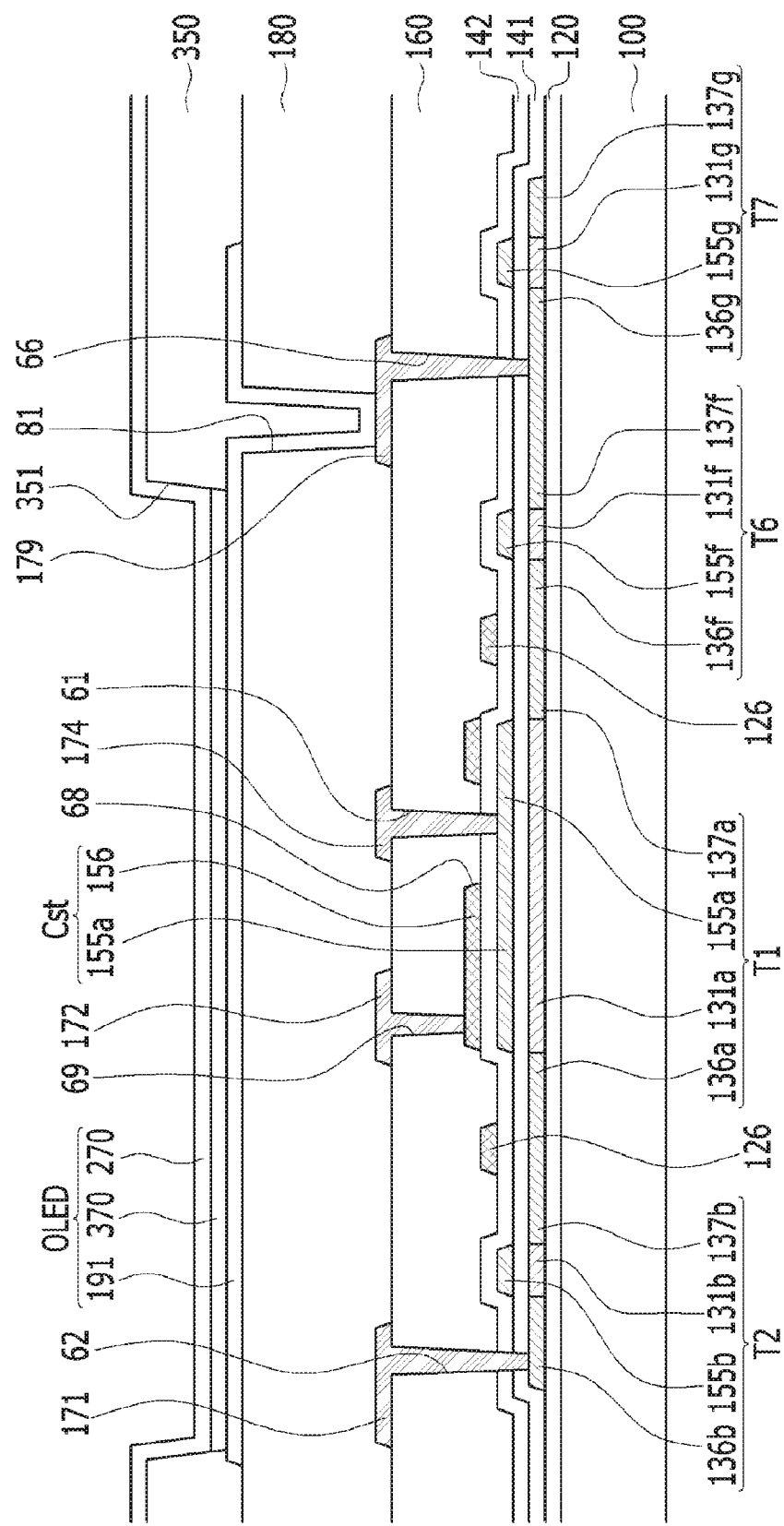
FIG. 6 is a cross-sectional view of the OLED display of FIG. 4 taken along line VI-VI.
Figure 7:
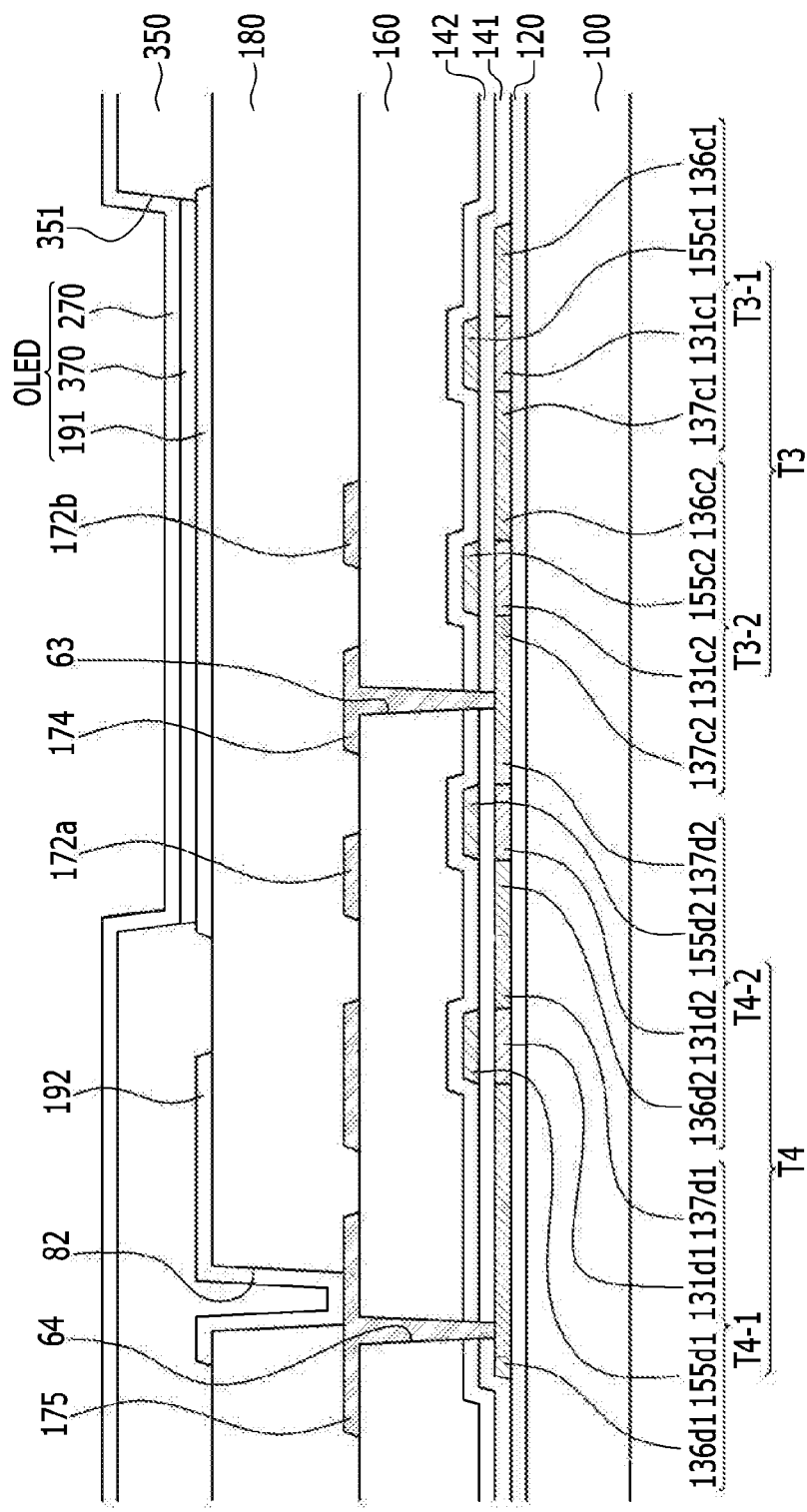
FIG. 7 is a cross-sectional view of the OLED display of FIG. 4 taken along line VII-VII.

Then, the detailed structure of one pixel of the OLED display according to an exemplary embodiment applied with the above structure will be described with reference to FIG. 3 to FIG. 7. FIG. 3 is a layout view of an OLED display according to an exemplary embodiment. FIG. 4 is a view schematically illustrating a plurality of transistors and capacitors of the OLED display of FIG. 3. FIG. 5 is a specific layout view of illustrating signal lines of the OLED display of FIG. 3. FIG. 6 is a cross-sectional view of the OLED display of FIG. 4 taken along line VI-VI. FIG. 7 is a cross-sectional view of the OLED display of FIG. 4 taken along line VII-VII.

Referring to FIG. 3, an OLED display according to an exemplary embodiment includes a scan line 151, a previous scan line 152, an emission control line 153, and a bypass control line 158 respectively transmitting a scan signal Sn, a previous scan signal Sn−1, an emission control signal EM, and a bypass signal BP and formed along a row direction. Also, a data line 171 and a driving voltage line 172 crossing the scan line 151, the previous scan line 152, the emission control line 153, and the bypass control line 158 and respectively applying a data signal Dm and a driving voltage ELVDD to the pixel 1 are further included. The initialization voltage Vint is transmitted from the initialization voltage line 192 through the initialization transistor T4 to the compensation transistor T3.

Further, a driving thin film transistor T1, a switching thin film transistor T2, a compensation thin film transistor T3, an initialization thin film transistor T4, an operation control thin film transistor T5, an emission control thin film transistor T6, a bypass thin film transistor T7, a storage capacitor Cst, and an OLED are formed in the pixel 1. The OLED includes a pixel electrode 191, an organic emission layer 370, and a common electrode 270. In this case, the compensation transistor T3 and the initialization transistor T4 are configured as a dual gate structure transistor in order to block leakage current.

Channels of the driving transistor T1, the switching transistor T2, the compensation transistor T3, the initialization transistor T4, the operation control transistor T5, the light emission control transistor T6, and the bypass transistor T7 are formed in one semiconductor 130, and the semiconductor 130 can be formed to be curved in various shapes. The semiconductor 130 can be formed of a polycrystalline semiconductor material or an oxide semiconductor material. The oxide semiconductor material can include any one oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide ($InGaZnO_4$), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. In the case where the semiconductor 130 is formed of the oxide semiconductor material, a separate passivation layer for protecting the oxide semiconductor material which is vulnerable to an external environment such as a high temperature can be added.

The semiconductor 130 includes a channel 131 which is doped with an N-type impurity or a P-type impurity, and a source doping part and a drain doping part which are formed at respective sides of the channel and doped with an opposite-type doping impurity to the doping impurity doped on the channel. In the exemplary embodiment, the source doping part and the drain doping part correspond to the source electrode and the drain electrode, respectively. The source electrode and the drain electrode formed in the semiconductor 130 can be formed by doping only the corresponding regions. Further, in the semiconductor 130, a region between source electrodes and drain electrodes of different transistors is doped and thus the source electrode and the drain electrode can be electrically connected to each other.

As shown in FIG. 4, the channel 131 includes a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, the driving source electrode 136a, and a driving drain electrode 137a. The driving channel 131a is curved and can have an oblique shape or a zigzag shape. As such, by forming the curved driving channel 131a, the driving channel 131a can be formed to be elongated in a narrow space. Accordingly, a driving range of the gate voltage applied to the driving gate electrode 155a is increased by the elongated driving channel 131a. Since the driving range of the gate voltage is increased, a gray scale of light emitted from the OLED can be finely controlled by changing the magnitude of the gate voltage, and as a result, the resolution of the OLED display can be enhanced and display quality can be improved. Various examples such as 'reverse S', 'S', 'M', and 'W' can be implemented by variously modifying the shape of the driving channel 131a.

The driving gate electrode 155a overlaps the driving channel 131a, and the driving source electrode 136a and the driving drain electrode 137a are formed at respective sides of the driving channel 131a to be close. The driving gate electrode 155a is connected to the first data connecting member 174 through a contact hole 61.

As shown in FIG. 5, the first shielding electrode 172a and the second shielding electrode 172b of the driving voltage line 172 are disposed between the first data connecting member 174 connected to the driving gate electrode 155a and two data lines 171 disposed on two sides of the first data connecting member 174. The first shielding electrode 172a and the second shielding electrode 172b are connected to the driving voltage line 172 and supplied with the driving voltage ELVDD having a constant magnitude.

As described above, the first shielding electrode 172a and the second shielding electrode 172b supplied with the driving voltage (ELVDD) having the constant magnitude are disposed between the data line 171 and first data connecting member 174 connected to the driving gate electrode 155a. Accordingly, the generation of the parasitic capacitance between the data line 171 and first data connecting member 174 connected to the driving gate electrode 155a can be minimized. Thus, the interference between the data signal Dm, Dm+1 transmitted through the data line 171 and the gate voltage Vg supplied to the driving gate electrode 155a can be prevented.

The switching transistor T2 includes the switching channel 131b, a switching gate electrode 155b, a switching source electrode 136b, and a switching drain electrode 137b. The switching gate electrode 155b which is a part extended downward from the scan line 121 overlaps the switching channel 131b, and the switching source electrode 136b and the switching drain electrode 137b are formed at respective sides of the switching channel 131b to be close. The switching source electrode 136b is connected to the data line 171 through a contact hole 62.

Two compensation transistors T3 are formed in order to prevent the leakage current, and include a first compensation transistor T3-1 and a second compensation transistor T3-2 which are adjacent to each other. The first compensation transistor T3-1 is positioned around the scan line 121, and the second compensation transistor T3-2 is positioned around a projection of the scan line 121. The first compensation transistor T3-1 includes a first compensation channel 131c1, a first compensation gate electrode 155c1, a first compensation source electrode 136c1, and a first compensation drain electrode 137c1, and the second compensation transistor T3-2 includes a second compensation channel 131c2, a second compensation gate electrode 155c2, a second compensation source electrode 136c2, and a second compensation drain electrode 137c2.

The first compensation gate electrode 155c1 which is a part of the scan line 121 overlaps the first compensation channel 131c1, and the first compensation source electrode 136c1 and the first compensation drain electrode 137c1 are formed at respective sides of the first compensation channel 131c1 to be close. The first compensation source electrode 136c1 is connected to a light emission control source electrode 136f and the driving drain electrode 137a, and the first compensation drain electrode 137c1 is connected to the second compensation source electrode 136c2.

The second compensation gate electrode 155c2 which is a projection protruding upward from the scan line 121 overlaps the second compensation channel 131c2, and the second compensation source electrode 136c2 and the second compensation drain electrode 137c2 are formed at respective sides of the second compensation channel 131c2 to be close. The second compensation drain electrode 137c2 is connected to a first data connection member 174 through a contact hole 63.

Two initialization transistors T4 are formed in order to prevent the leakage current, and include a first initialization transistor T4-1 and a second initialization transistor T4-2 which are adjacent to each other. The first initialization transistor T4-1 is positioned around the previous scan line 122, and the second initialization transistor T4-2 is positioned around a projection of the previous scan line 122. The first initialization transistor T4-1 includes a first initialization channel 131d1, a first initialization gate electrode 155d1, a first initialization source electrode 136d1, and a first initialization drain electrode 137d1, and the second initialization transistor T4-2 includes a second initialization channel 131d2, a second initialization gate electrode 155d2, a second initialization source electrode 136d2, and a second initialization drain electrode 137d2.

The first initialization gate electrode 155d1 which is a part of the previous scan line 152 overlaps the first initialization channel 131d1 and is formed at both sides of the first initialization channel 131d1 to be close. The first initialization source electrode 136d1 is connected to a second data connection member 175 through a contact hole 64, and the first initialization drain electrode 137d1 is connected to the second initialization source electrode 136d2.

The second initialization gate electrode 155d2 which is a projection protruding downward from the previous scan line 152 overlaps the second initialization channel 131d2, and the second initialization source electrode 136d2 and the second initialization drain electrode 137d2 are formed at respective sides of the second initialization channel 131c2 to be close. The second initialization drain electrode 137d2 is connected to the first data connection member 174 through the contact hole 63.

As such, the compensation transistor T3 includes two of the first compensation transistor T3-1 and the second compensation transistor T3-2, while the initialization transistor T4 includes two of the first initialization transistor T4-1 and the second initialization transistor T4-2, and as a result, it is possible to efficiently prevent the leakage current from being generated by blocking an electron moving path of the semiconductor 130 in the off state.

The operation control transistor T5 includes the operation control channel 131e, an operation control gate electrode 155e, the operation control source electrode 136e, and the operation control drain electrode 137e. The operation control gate electrode 155e which is a part of the light emission control line 153 overlaps the operation control channel 131e, and the operation control source electrode 136e and the operation control drain electrode 137e are formed at respective sides of the operation control channel 131e to be close.

The operation control source electrode 136e is connected to a part of the driving voltage line 172 through a contact hole 65.

The light emission control transistor T6 includes the light emission control channel 131f, a light emission control gate electrode 155f, the light emission control source electrode 136f, and a light emission control drain electrode 137f. The light emission control gate electrode 155f which is a part of the light emission control line 153 overlaps the light emission control channel 131f, and the emission control source electrode 136f and the emission control drain electrode 137f are formed at respective sides of the emission control channel 131f to be close. The light emission control drain electrode 137f is connected to a third data connection member 179 through a contact hole 66.

The bypass transistor T7 includes the bypass channel 131g, a bypass gate electrode 155g, a bypass source electrode 136g, and a bypass drain electrode 137g. The bypass gate electrode 155g which is a part of the bypass control line 128 overlaps with the bypass channel 131g, and the bypass source electrode 136g and the bypass drain electrode 137g are formed at respective sides of the bypass channel 131g to be close. The bypass source electrode 136g is connected through a contact hole 81 to the third data connecting member 179, and the bypass drain electrode 137g is connected directly with the first initialization source electrode 136d1.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes the first storage electrode 155a and a second storage electrode 156 which are disposed with a second insulating layer 142 therebetween. The first storage electrode 155a corresponds to the driving gate electrode 155a, and the second storage electrode 156 is a portion extended from a storage line 126, occupies a larger area than the driving gate electrode 155a, and fully covers the driving gate electrode 155a. Herein, a second insulating layer 142 is a dielectric material, and a storage capacitance is determined by charges stored in the storage capacitor Cst and a voltage between the two electrodes 155a and 156. As such, the driving gate electrode 155a is used as the first storage electrode 155a, and as a result, it is possible to ensure a space in which the storage capacitor can be formed within a space narrowed by the driving channel 131a having a large area in the pixel.

The first storage electrode 155a which is the driving gate electrode 155a is connected to one end of the first data connection member 174 through the contact hole 61 and a storage opening 68. The storage opening 68 is an opening formed in the second storage electrode 156. The first data connection member 174 is formed on the same layer to be substantially parallel to the data line 171, and the other end of the first data connection member 174 is connected to the second compensation drain electrode 137c2 of the second compensation transistor T3-2 and the second initialization drain electrode 137d2 of the second initialization transistor T4-2 through the contact hole 63. Accordingly, the first data connection member 174 connects the driving gate electrode 155a and the second compensation drain electrode 137c2 of the second compensation transistor T3-2, and the second initialization drain electrode 137d2 of the second initialization transistor T4-2, to each other.

The second storage electrode 156 is connected to the driving voltage line 172 through a contact hole 69.

Accordingly, the storage capacitor Cst stores a storage capacitance corresponding to a difference between the driving voltage ELVDD transferred to the second storage electrode 156 through the driving voltage line 172 and the gate voltage Vg of the driving gate electrode 155a.

The third data connection member 179 is connected to the pixel electrode 191 through the contact hole 81 and the second data connection member 175 is connected to the initialization voltage line 192 through a contact hole 82.

Hereinafter, cross-sectional structures of the pixel unit and the peripheral unit in the OLED display according to the exemplary embodiment will be described in detail with reference to FIG. 6 and FIG. 7 along with FIG. 3 to FIG. 5.

In this case, since a lamination structure of the operation control transistor T5 is mostly the same as that of the light emission control transistor T6, a detailed description thereof will be omitted.

A buffer layer 120 can be formed on a substrate 100. The substrate 100 can be formed by insulating substrates formed of glass, crystal, ceramic, plastic, and the like, and the buffer layer 120 blocks impurities from the substrate 100 during a crystallization process for forming a polycrystalline semiconductor to serve to improve characteristics of the polycrystalline semiconductor and reduce stress applied to the substrate 100.

On the buffer layer 120 of the pixel unit P, a semiconductor 130 is formed, which includes a driving channel 131a, a switching channel 131b, a compensation channel 131c, an initialization channel 131d, an operation control channel 131e, and a light emission control channel 131f. A driving source electrode 136a and a driving drain electrode 137a are formed on respective sides of the driving channel 131a in the semiconductor 130, and a switching source electrode 136b and a switching drain electrode 137b are formed on respective sides of the switching channel 131b. In addition, a first compensation source electrode 136c1 and a first compensation drain electrode 137c1 are formed on respective sides of a first compensation channel 131c1, a second compensation source electrode 136c2 and a second compensation drain electrode 137c2 are formed on respective sides of a second compensation channel 131c2, a first initialization source electrode 136d1 and a first initialization drain electrode 137d1 are formed on respective sides of a first initialization channel 131d1, and a second initialization source electrode 136d2 and a second initialization drain electrode 137d2 are formed on respective sides of a second initialization channel 131d2. Further, an operation control source electrode 136e and an operation control drain electrode 137e are formed on respective sides of the operation control channel 131e, and a light emission control source electrode 136f and a light emission control drain electrode 137f are formed on respective sides of the light emission control channel 131f. Also, a bypass source electrode 136g and a bypass drain electrode 137g are formed at respective sides of the bypass channel 131g.

A first insulating layer 141 covering the semiconductor 130 is formed on semiconductor 130. First gate wiring 151, 152, 153, 158, 155a, 155b, 155c1, 155c2, 155d1, 155d2, 155e, and 155f which include a scan line 151 including a switching gate electrode 155b, a first compensation gate electrode 155c1, and a second compensation gate electrode 155c2, a previous scan line 152 including a first initialization gate electrode 155d1 and a second initialization gate electrode 155d2, a light emission control line 153 including an operation control gate electrode 155e and a light emission control gate electrode 155f, a bypass control line 158 including the bypass gate electrode 155g, and a driving gate electrode (first storage electrode) 155a is formed on the first insulating layer 141.

A second gate insulating layer 142 covering the first gate wiring 151, 152, 153, 158, 155a, 155b, 155c1, 155c2, 155d1, 155d2, 155e, and 155f and the first gate insulating layer 141 is formed thereon. The first insulating layer 141 and the second insulating layer 142 are formed of a silicon nitride ($SiN_x$) or a silicon oxide ($SiO_x$).

Second gate wiring 126 and 156 including a storage line 126 disposed to be parallel to the scan line 121 and a second storage electrode 156 which is a portion extended from the storage line 126 is formed on the second insulating layer 142.

An interlayer insulating layer 160 is formed on the second gate insulating layer 142 and the second gate wiring 126 and 156. The interlayer insulating layer 160 can be formed of a silicon nitride ($SiN_x$) or a silicon oxide ($SiO_x$).

The interlayer insulating layer 160 has contact holes 61, 62, 63, 64, 65, 66, and 69. Data wiring 171, 172, 172a, 172b, 174, 175, 179 including a data line 171, a driving voltage line 172, a first data connecting member 174, a second data connecting member 175, and a third data connecting member 179 is formed on the interlayer insulating layer 160. The Data wiring 171, 172, 172a, 172b, 174, 175, 179 are formed on the same layer.

The data line 171 is connected to the switching source electrode 136b through the contact hole 62 formed in the first gate insulating layer 141, the second gate insulating layer 142, and the interlayer insulating layer 160. One end of the first data connecting member 174 is connected to the driving gate electrode 155a through the contact hole 61 formed in the second gate insulating layer 142 and the interlayer insulating layer 160. The other end of the first data connecting member 174 is connected to the second compensation drain electrode 137c2 and the second initialization drain electrode 137d2 through the contact hole 63 formed in the first gate insulating layer 141, the second gate insulating layer 142, and the interlayer insulating layer 160.

The first shielding electrode 172a and the second shielding electrode 172b of the driving voltage line 172 are disposed between the first data connecting member 174 connected to the driving gate electrode 155a and two data lines 171 disposed on two sides of the first data connecting member 174. The first shielding electrode 172a and the second shielding electrode 172b are connected to the driving voltage line 172 and supplied with the driving voltage ELVDD having a constant magnitude. As described above, the first shielding electrode 172a and the second shielding electrode 172b supplied with the driving voltage (ELVDD) having the constant magnitude are disposed between the data line 171 and first data connecting member 174 connected to the driving gate electrode 155a. Accordingly, the generation of the parasitic capacitance between the data line 171 and first data connecting member 174 connected to the driving gate electrode 155a can be prevented.

Accordingly, as though the data signal Dm, Dm+1 transmitted through the data line 171, the interference between the data signal Dm, Dm+1 transmitted through the data line 171 and the gate voltage Vg supplied to the driving gate electrode 155a can be prevented.

A quadrangular second data connection member 175 is connected to the first initialization source electrode 136d1 through the contact hole 64 formed in the first gate insulating layer 141, the second gate insulating layer 142, and the interlayer insulating layer 160. In addition, a quadrangular third data connection member 179 is connected to the light emission control drain electrode 137f through the contact hole 66 formed in the first gate insulating layer 141, the second gate insulating layer 142, and the interlayer insulating layer 160.

A passivation layer 180 covering the data wiring 171, 172, 172a, 172b, 174, 175, 179, and the interlayer insulating layer 160 is formed thereon. The passivation layer 180 can be formed by an organic layer.

The pixel electrode 191 and the initialization voltage line 192 are formed on the passivation layer 180. The third data connection member 179 is connected to the pixel electrode 191 through a contact hole 81 formed on the passivation layer 180, and the second data connection member 175 is connected to the initialization voltage line 192 through a contact hole 82 formed on the passivation layer 180.

A pixel defined layer (PDL) 350 covering the passivation layer 180, the initialization voltage line 192, and the pixel electrode 191 is formed on edges of the passivation layer 180, the initialization voltage line 192, and the pixel electrode 191, and the pixel defined layer 350 has a pixel opening 351 that exposes the pixel electrode 191. The pixel defined layer 350 can be made of resins such as a polyacrylate resin and a polyimide or silica-series inorganic materials.

An organic emission layer 370 is formed on the pixel electrode 191 exposed by the pixel opening 351 and a common electrode 270 is formed on the organic emission layer 370. The common electrode 270 is formed on the pixel defined layer 350 to be formed through the plurality of pixels. As such, an OLED is formed, which includes the pixel electrode 191, the organic emission layer 370, and the common electrode 270.

Herein, the pixel electrode 191 is an anode which is a hole injection electrode and the common electrode 270 is a cathode which is an electron injection electrode. However, the exemplary embodiment according to the described technology is not necessarily limited thereto, and the pixel electrode 191 can be the cathode and the common electrode 270 can be the anode according to a driving method of the OLED display. When holes and electrons are injected into the organic emission layer 370 from the pixel electrode 191 and the common electrode 270, respectively, and excitons acquired by combining the injected holes and electrons fall from an excitation state to a ground state, light is emitted.

The organic emission layer 370 is made of a low-molecular organic material or a high-molecular organic material such as poly(3,4-ethylenedioxythiophene) (PEDOT). Further, the organic emission layer 370 can be formed by multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode, and the hole transporting layer, the emission layer, the electron transporting layer, and the electron injection layer are sequentially laminated thereon.

The organic emission layer 370 can include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

The white organic emission layer described in another example can be, of course, formed by one organic emission layer, and includes even a configuration that can emit white light by laminating a plurality of organic emission layers. As an example, the white organic emission layer can include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the OLED can be formed on the common electrode 270, and the encapsulation member can be sealed to the substrate 100 by a sealant and can be formed of various materials such as glass, quartz, ceramic, plastic, and a metal. On the other hand, a thin film encapsulation layer can be formed on the common electrode 270 by depositing the inorganic layer and the organic layer with the usage of the sealant.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A organic light-emitting diode (OLED) display comprising:
   a substrate;
   a scan line formed over the substrate and configured to carry a scan signal;
   a first data line and a second data line adjacent to each other and crossing the scan line, wherein the first and second data lines are configured carry a data voltage;
   a driving voltage line crossing the scan line and configured to receive a driving voltage from a constant voltage source;
   a switching transistor electrically connected to the scan line and the data line and including a switching drain electrode configured to output the data voltage;
   a driving transistor including a driving gate electrode and a driving source electrode electrically connected to the switching drain electrode;
   an OLED electrically connected to the driving drain electrode of the driving transistor;
   a connector connected to the driving gate electrode of the driving transistor and interposed between the first and second data lines;

a first shielding electrode interposed between the connector and the first data line; and
a second shielding electrode interposed between the connector and the second data line,
wherein the first and second shielding electrodes are connected to the constant voltage source, wherein the second shielding electrode has two horizontal portions extending in a first direction crossing the first and second data lines and a vertical portion extending in a second direction crossing the scan line, and wherein the horizontal portions are directly connected to the first shielding electrode, and
wherein the first and second shielding electrodes fully surround a perimeter of the connector.

2. The OLED display of claim 1, wherein the first and second shielding electrodes are electrically connected to the driving voltage line.

3. The OLED display of claim 2, wherein the first shielding electrode and the first data line extend parallel with each other, and wherein the second shielding electrode and the second data line extend parallel with each other.

4. The OLED display of claim 3, wherein the connector is formed on the same layer as the first and second shielding electrodes.

5. The OLED display of claim 4, wherein at least a portion of the connector is formed on the same layer as the first and second data lines.

6. The OLED display of claim 1, wherein at least a portion of the first shielding electrode and the first data line extend parallel with each other, and wherein the second shielding electrode and the second data line extend parallel with each other.

7. The OLED display of claim 6, wherein at least a portion of the connector is formed on the same layer as the first and second shielding electrodes.

8. The OLED display of claim 7, wherein at least a portion of the connector is formed on the same layer as the first and second data lines.

9. The OLED display of claim 1, wherein at least a portion of the connector is formed on the same layer as the first and second shielding electrodes.

10. The OLED display of claim 9, wherein the connector is formed on the same layer as the first and second data lines.

11. The OLED display of claim 1, further comprising:
a semiconductor formed over the substrate and including a switching channel of the switching transistor and a driving channel of the driving transistor; and
a first gate insulating layer formed over the semiconductor, wherein the driving channel is curved.

12. The OLED display of claim 11, further comprising:
a storage capacitor including a first storage electrode formed over the first gate insulating layer and overlapping the driving channel;
a second gate insulating layer covering the first storage electrode; and
a second storage electrode formed over the second gate insulating layer and overlapping the first storage electrode in the depth dimension of the OLED display,
wherein the first storage electrode includes the driving gate electrode of the driving transistor.

13. The OLED display of claim 12, further comprising an interlayer insulating layer covering the second storage electrode, wherein the first and second data lines are formed over the interlayer insulating layer.

14. The OLED display of claim 13, wherein the connector, the first and second shielding electrodes, and the first and second data lines are formed on the same layer.

15. The OLED display of claim 1, wherein the connector, the first and second shielding electrodes, and the first and second data lines are formed on the same layer.

16. The OLED display of claim 1, wherein each of the horizontal portions of the second shielding electrode is thinner than the vertical portion.

17. A organic light-emitting diode (OLED) display comprising:
a substrate;
a scan line formed over the substrate and configured to carry a scan signal;
a first data line and a second data line adjacent to each other and crossing the scan line, wherein the first and second data lines are configured carry a data voltage;
a driving voltage line crossing the scan line, having an opening, and configured to receive a driving voltage from a constant voltage source;
a switching transistor electrically connected to the scan line and the data line and including a switching drain electrode configured to output the data voltage;
a driving transistor including a driving gate electrode and a driving source electrode electrically connected to the switching drain electrode;
an OLED electrically connected to the driving drain electrode of the driving transistor; and
a connector connected to the driving gate electrode of the driving transistor and interposed between the first and second data lines;
wherein the connector connected to the driving gate electrode is disposed within the opening and the driving voltage line fully surround a perimeter of the connector in a plan view.

* * * * *